United States Patent
Porterfield

(10) Patent No.: US 7,624,310 B2
(45) Date of Patent: Nov. 24, 2009

(54) SYSTEM AND METHOD FOR INITIALIZING A MEMORY SYSTEM, AND MEMORY DEVICE AND PROCESSOR-BASED SYSTEM USING SAME

(75) Inventor: A. Kent Porterfield, Lino Lakes, MN (US)

(73) Assignee: Micron Technology, Inc., Boise, ID (US)

( * ) Notice: Subject to any disclaimer, the term of this patent is extended or adjusted under 35 U.S.C. 154(b) by 308 days.

(21) Appl. No.: 11/827,541

(22) Filed: Jul. 11, 2007

(65) Prior Publication Data

US 2009/0019323 A1    Jan. 15, 2009

(51) Int. Cl.
*G06K 5/04* (2006.01)
(52) U.S. Cl. .................. 714/700; 714/707; 711/100; 711/5; 375/371; 710/61; 370/503; 713/503
(58) Field of Classification Search .............. None
See application file for complete search history.

(56) References Cited

U.S. PATENT DOCUMENTS

| | | | | |
|---|---|---|---|---|
| 5,455,831 | A * | 10/1995 | Bartow et al. ............. | 714/700 |
| 6,530,001 | B1 | 3/2003 | Lee ........................... | 711/154 |
| 6,625,675 | B2 * | 9/2003 | Mann ......................... | 710/61 |
| 7,433,441 | B2 * | 10/2008 | Jenkins et al. ............. | 375/371 |
| 7,466,723 | B2 * | 12/2008 | Vakil et al. ................ | 370/503 |
| 2005/0188146 | A1 * | 8/2005 | Teo ............................ | 711/5 |
| 2005/0262289 | A1 * | 11/2005 | Okuda ....................... | 711/100 |
| 2006/0053328 | A1 * | 3/2006 | Panikkar et al. .......... | 713/503 |
| 2008/0276032 | A1 | 11/2008 | Iida et al. .................. | 710/316 |

FOREIGN PATENT DOCUMENTS

WO         99/46687        9/1999

\* cited by examiner

*Primary Examiner*—John P Trimmings
(74) *Attorney, Agent, or Firm*—Dorsey & Whitney LLP

(57) ABSTRACT

Systems, controllers and methods are disclosed, such as an initialization system including a controller that receives patterns of read data coupled from a memory device through a plurality of read data lanes. The controller is operable to detect any lane-to-lane skew in the patterns of read data received through the read data lanes. The controller then adjusts the manner in which the read data received through the read data lanes during normal operation are divided into frames. The controller can also couple patterns of command/address bits to the memory device through a plurality of command/address lanes. The memory device can send the received command/address bits back to the controller through the read data lanes. The controller is operable to detect any lane-to-lane skew in the patterns of command/address bits received through the read data lanes to adjust the manner in which the command/address bits coupled through the command/address lanes during normal operation are divided into frames.

32 Claims, 7 Drawing Sheets

| | BIT-TIME 0 | BIT-TIME 1 | BIT-TIME 2 | BIT-TIME 3 | BIT-TIME 4 | BIT-TIME 5 | BIT-TIME 6 | BIT-TIME 7 | BIT-TIME 8 |
|---|---|---|---|---|---|---|---|---|---|
| CA LANE 0 | CA/Wdata | CA/Wdata | CA/Wdata | CA/Wdata | CA/Wdata | CA/Wdata | CA/Wdata | CA/Wdata | CRC |
| CA LANE 1 | CA/Wdata | CA/Wdata | CA/Wdata | CA/Wdata | CA/Wdata | CA/Wdata | CA/Wdata | CA/Wdata | CRC |
| CA LANE 2 | CA/Wdata | CA/Wdata | CA/Wdata | CA/Wdata | CA/Wdata | CA/Wdata | CA/Wdata | CA/Wdata | CRC |
| CA LANE 3 | CA/Wdata | CA/Wdata | CA/Wdata | CA/Wdata | CA/Wdata | CA/Wdata | CA/Wdata | CA/Wdata | CRC |
| CA LANE 4 | CA/Wdata | CA/Wdata | CA/Wdata | CA/Wdata | CA/Wdata | CA/Wdata | CA/Wdata | CA/Wdata | CRC |
| CA LANE 5 | CA/Wdata | CA/Wdata | CA/Wdata | CA/Wdata | CA/Wdata | CA/Wdata | CA/Wdata | CA/Wdata | CRC |

FIGURE 3

| | BIT-TIME 0 | BIT-TIME 1 | BIT-TIME 2 | BIT-TIME 3 | BIT-TIME 4 | BIT-TIME 5 | BIT-TIME 6 | BIT-TIME 7 | BIT-TIME 8 |
|---|---|---|---|---|---|---|---|---|---|
| DQ LANE 0 | Rdata | Rdata | Rdata | Rdata | Rdata | Rdata | Rdata | Rdata | CRC |
| DQ LANE 1 | Rdata | Rdata | Rdata | Rdata | Rdata | Rdata | Rdata | Rdata | CRC |
| DQ LANE 2 | Rdata | Rdata | Rdata | Rdata | Rdata | Rdata | Rdata | Rdata | CRC |
| DQ LANE 5 | Rdata | Rdata | Rdata | Rdata | Rdata | Rdata | Rdata | Rdata | CRC |

SYSTEM AND METHOD FOR INITIALIZING A MEMORY SYSTEM, AND MEMORY DEVICE AND PROCESSOR-BASED SYSTEM USING SAME

TECHNICAL FIELD

This invention relates generally to memory devices, and, more particularly, to a system and method for initializing communications with a plurality of memory devices as well as memory devices and processor-based system using same.

BACKGROUND OF THE INVENTION

Traditionally, dynamic random access memory ("DRAM") devices have been architected for "multi-drop" configurations in which signal lines are connected to several signal terminals in parallel. As the operating speed of memory devices continues to increase, this approach fails to provide adequate performance. More recent DRAM device architectures have abandoned the multi-drop approach and are instead architected for point-to-point configurations in which each signal line is connected between only two signal terminals. Point-to-point configurations allow cleaner, more controlled signaling that allows much higher data transfer rates. Point-to-point topologies require low pin count, and high data rates per pin in order to maintain and expand system memory density.

With further increases in the operating speed of memory devices, even point-to-point architectures can become inadequate. In particular, timing skew between command, address and data signals transmitted in parallel in multiple lanes, i.e., buses, can become skewed relative to each other. Further, the timing between these command, address and data signals can become skewed relative to clock signals forwarded along with the command, address and data signals. As a result, it is often necessary to initialize memory systems before they can be used. The circuitry needed to accomplish this initialization in both a host controller and each of several memory devices coupled to either the host controller or another memory device can be highly complex. In a processor-based system having a large number of memory devices, the cost added to the system by including this complex circuitry in the host controller and all of the memory devices can increase the cost of such processor-based systems.

There is therefore a need for an initialization system and method that can, for example, relatively inexpensively initialize a memory system that couples data to and from memory devices through high-speed buses.

BRIEF DESCRIPTION OF THE DRAWINGS

FIG. 3 is a schematic diagram showing one embodiment of a frame packet containing commands, addresses and write data used in the dedicated memory channel of FIG. 2.

FIG. 4 is a schematic diagram showing one embodiment of a read data frame packet used in the dedicated memory channel of FIG. 2.

DETAILED DESCRIPTION

Figure 1:
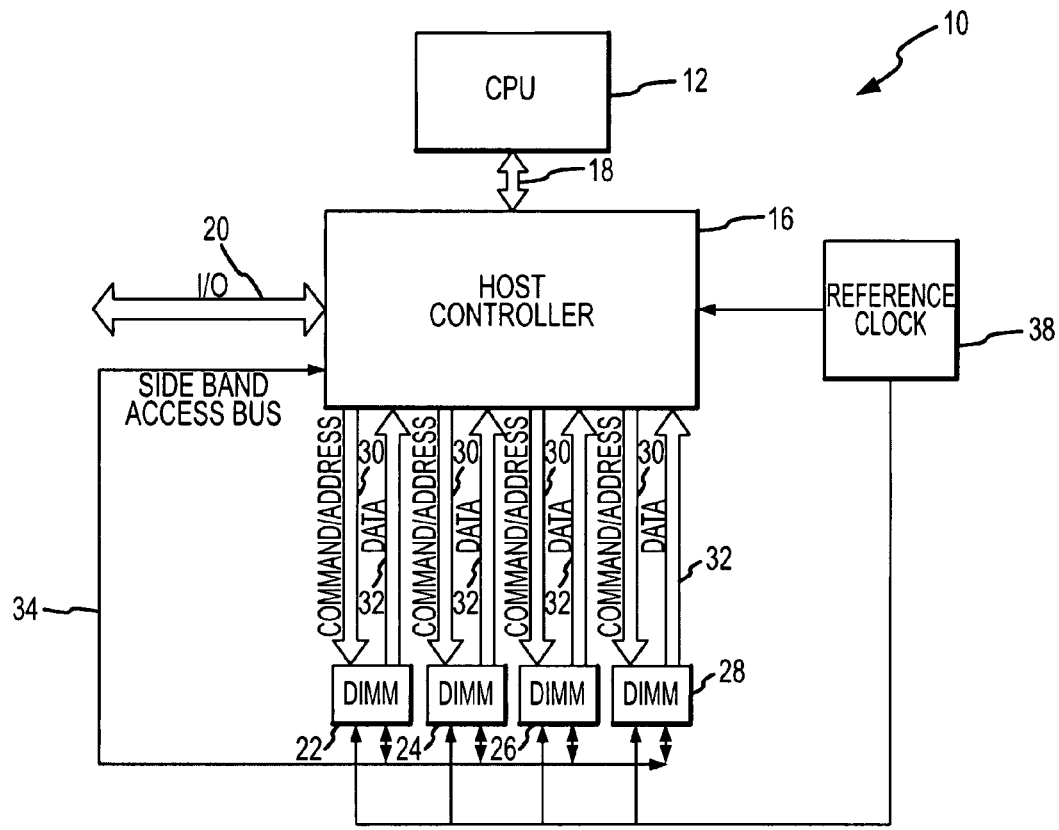
FIG. 1 is a block diagram of a computer system according to one embodiment of the invention.

A computer system 10 according to one embodiment of the invention is shown in the FIG. 1. The computer system 10 includes a central processing unit ("CPU") 12 connected to a host controller 16 through a processor bus 18. The host controller 16 is connected to a peripheral input/output ("I/O") bus 20 and to four double in-line memory modules ("DIMMs") 22, 24, 26, 28. The DIMMs 22-28 receive commands, addresses and write data from the host controller 16 through a uni-directional command/address ("CA") bus 30, and they transmit read data to the host controller 16 through a uni-directional data bus 32. Additionally, the DIMMs 22-28 are coupled to the host controller 16 through a Side Band access bus 34. As explained in greater detail below, the Side Band access bus 34 is used to pass configuration data to the DIMMs 22-28. Finally, the host controller 16 and each of the DIMMs receive a clock signal from a reference clock generator 38.

As mentioned before, the point-to-point data ("DQ") bus is daisy-chained between DRAM devices on a DIMM 22-28 in a point-to-point architecture. The last device on the DIMM 22-28 will transmit memory data on the bus as fast as possible to minimize latency. The last device defines the frame boundaries for read data. Intermediate DRAM devices between the last device and the host merge their data into the DQ data stream aligned with the frame boundaries so that DQ frames are not truncated when making back-to-back accesses to different devices on the same DIMM 22-28. From the perspective of the host, there are no gaps on the DQ bus while making back-to-back read requests. Devices upstream from the last device identify the frame boundaries on the secondary DQ bus, and identify the specific frame in which to merge DQ data. Training sequences are used to both identify the frame boundaries, and the specific frame relative to a command issued on the CA bus.

Figure 2:
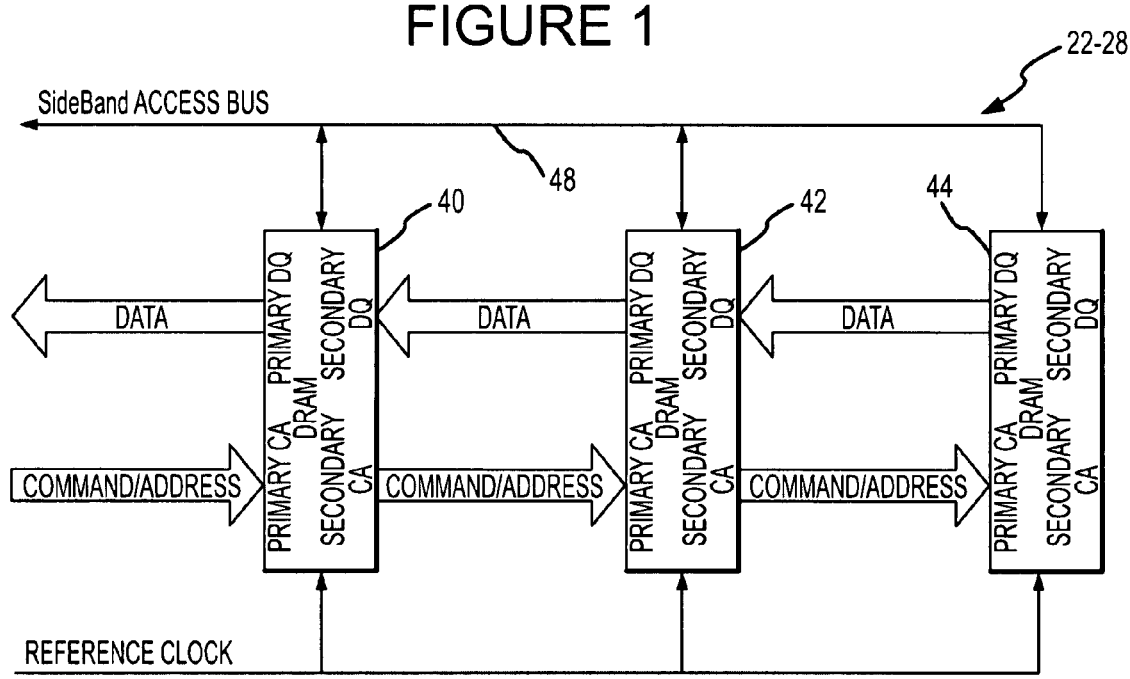
FIG. 2 is block diagram of one embodiment of a dedicated memory channel between a host controller and memory devices used in the computer system of FIG. 1.

Each of the DIMMs 22-28 shown in FIG. 1 has a dedicated memory channel between it and the host controller 16, which is shown in greater detail in FIG. 2. As shown in FIG. 2, a plurality of memory devices 40-44 are connected in a daisy-chain fashion on each of the DIMMs 22-28. Frame packets containing commands, addresses and write data are forwarded from the host controller 16 (FIG. 1) to the first memory device 40, from the first memory device 40 to the second memory device 42, etc. in the daisy-chain. Likewise, packets containing read data are transmitted from the last memory device 44 to the second memory device 42, etc. in a daisy-chain fashion to reach the host controller 16. As mentioned above, device configuration from the bus 34 (FIG. 1) is coupled through a low-speed serial Side Band Access Bus 48 to a side band port in each of the memory devices 40-44 to allow the host controller 16 to read from and write to internal device configuration registers. The clock signal from the reference clock generator 38 (FIG. 1) is also provided to each of the memory devices 40-44 so that an internal phase-lock loop ("PLL") in each of the memory devices 40-44 may synthesize the high-speed clocks needed to transmit data.

The host controller 16 and memory devices 40-44 communicate using a high-speed point-to-point bus architecture, which will sometimes be referred to herein as a "link" bus. The host controller 16 (FIG. 1) issues frame packets containing commands, addresses and write date on the uni-directional CA bus 30 as shown in FIG. 1, which are applied to each DRAM device 40-44 in a daisy-chain fashion as shown in FIG. 2. The DRAM devices 40-44 return read data to the host controller 16 on the uni-direction data bus 32, as also shown in FIG. 1. The read data are passed from one DRAM device 40-44 to the next in a daisy-chain fashion as explained above with reference to FIG. 2.

The frame packets containing commands, addresses and write data are, in one embodiment, organized in a 54-bit frame, which is nine bit-times on each of the six CA lanes as shown in FIG. 3. In one embodiment, read data information is organized in a 36-bit frame packet which is nine bit-times on each of the four DQ lanes as shown in FIG. 4. Cyclic Redundancy check ("CRC") bits may be included in the frame packets to detect and correct serial bit errors. Because of variations in trace delays and other conditions, the nine frame packet bits from each lane may be skewed between link lanes. It is the responsibility of logic in the DRAM devices 40-44 to de-serialize the nine bits from each lane, and then align the data from each lane data to reconstitute the frame, as explained in greater detail below.

Figure 5:
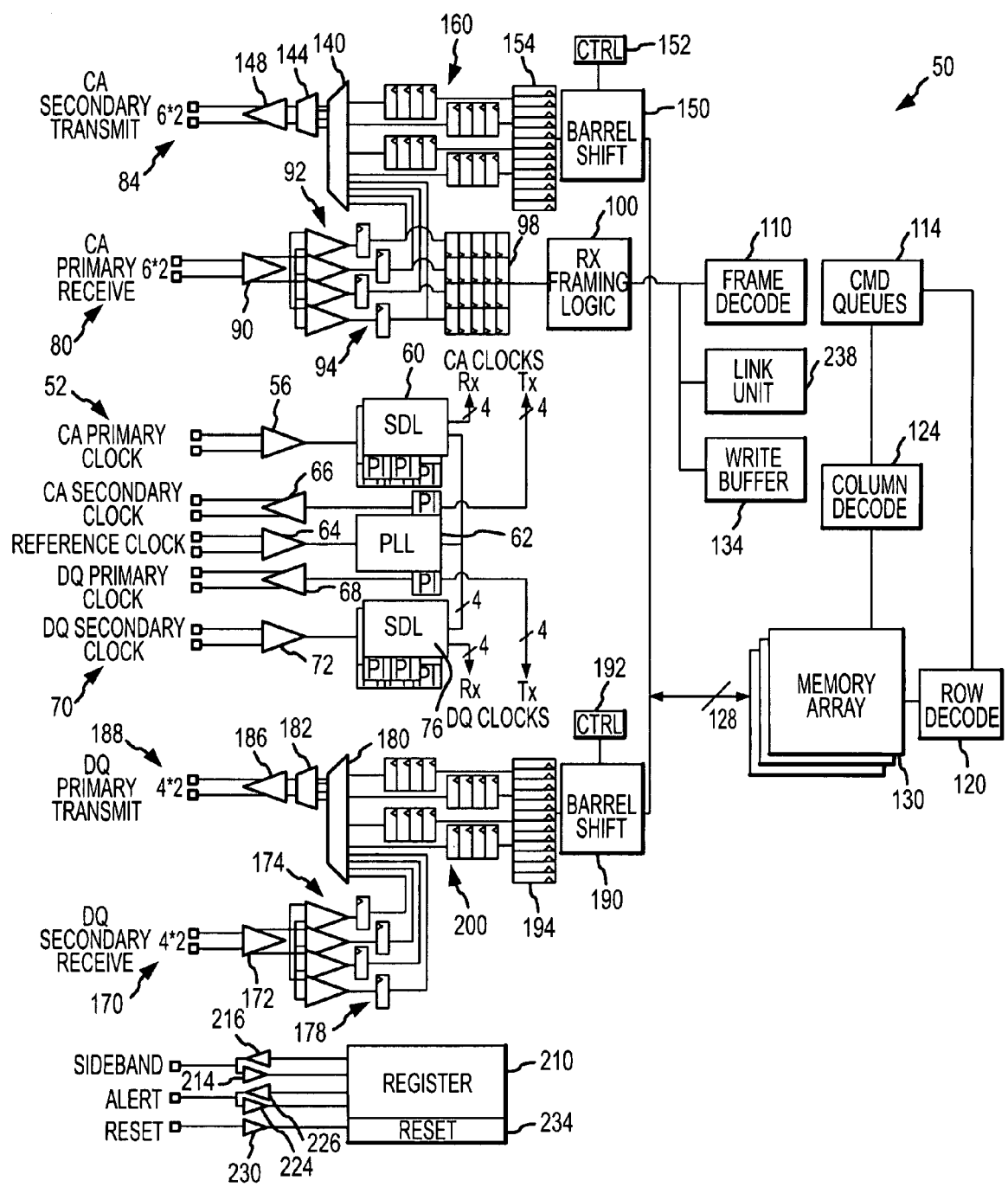
FIG. 5 is a block diagram of a memory device according to one embodiment of the invention that may be used in the computer system of FIG. 1.

A memory device 50 according to one embodiment of the invention is shown in greater detail in FIG. 5. Most of the components of the memory device 50 are also used in the host controller 16 to transmit and receive the same signals that are transmitted and received by the memory device 50. The memory device 50 receives a differential CA Primary Clock signal at port 52, which is forwarded from either the host controller 16 or an upstream memory device along with frame packets containing commands, addresses and write data. The forwarded CA Primary Clock signal has a frequency that is a fraction, e.g., one-quarter, of the frequency that data are transmitted. Differential signaling is used at the port 52 to provide good noise immunity and signal integrity. The CA Primary Clock signal is applied to a differential receiver 56, which converts the signal to a single-ended clock signal and applies it to a synchronous delay line ("SDL") 60. The differential receiver 56, as well as other differential receivers in the memory device 50 described below, may be calibrated to compensate for DC offset differences. During calibration the inputs of operational amplifiers used in the receivers may be placed at the same voltage, which produces random data at the receiver output. If there is no DC offset difference, the differential receiver randomly produces as many ones as zeros when sampled over a long period of time. When there is a DC offset difference, the sample will be weighted towards mostly zeros, or mostly ones. Summing logic can determine if there is an equal distribution of ones and zeros during a sample period. This offset cancellation can be applied to both differential receivers for passing frame packet bits and differential receivers for passing forwarded clock signals.

With further reference to FIG. 5, the SDL 60 generates four-phases of a Receive ("Rx") CA Clock signal, which are in the same clock domain as the host controller 16 or memory device transmitting the CA primary Clock signal. The SDL 60 uses a four-phase internal clock signal generated by a phase-lock loop ("PLL") 62 to generate four-phases of the Rx CA Clock Signal. The PLL 62 receives the Reference Clock signal output from the Reference Clock generator 38 through a receiver 64 to also generate four-phases of a Transmit ("Tx") CA Clock signal, which are in the same clock domain as the memory device 50. The PLL 62 also generates and outputs through a transmitter 66 four-phases of a CA Secondary Clock signal, which are applied to the CA primary Clock port 52 of a downstream memory device. Finally, the PLL 62 generates and outputs through a transmitter 68 four-phases of a DQ Primary Clock signal, which are applied to the DQ Secondary Clock port of either the host controller 16 or an upstream memory device. The DQ Primary Clock signal is typically transmitted to a differential DQ Secondary Clock signal at port 70 of the host controller 16 or an upstream memory device along with read data. The DQ Secondary Clock signal is coupled through a differential receiver 72 and applied to another SDL 76, which generates four-phases of an Rx DQ Clock signal in the same manner that the SDL 60 generates the four-phases of the Rx CA Clock signal, as explained above. The Rx DQ Clock signal is used to capture read data from a downstream memory device, as explained above. The PLL 62 also generates four-phases of a Tx DQ Clock signal in the same manner that it generates the four-phase of the Tx CA Clock signal. The Tx DQ Clock signal is used to synchronize the processing of read data from the downstream memory device in the clock domain of the memory device 50.

The memory device also includes a CA Primary Receive Port 80, which has 6 lanes. The CA Primary Receive Port 80 receive the frame packets containing commands and addresses as well as write data for storage in the memory device 50 or in a downstream memory device. Each frame packet consists of 9 sets of 6-bit packet words so that each frame packet contains 54 bits. To facilitate daisy-chaining to downstream memory devices, the memory device 50 includes a CA Secondary Transmit port 84, which is coupled to the CA Primary Receive port 80 of a downstream memory device (not shown). Each port 80, 84 may be capable of data transfer rates from 3.2 GT/s-6.4 GT/s.

Figure 6:
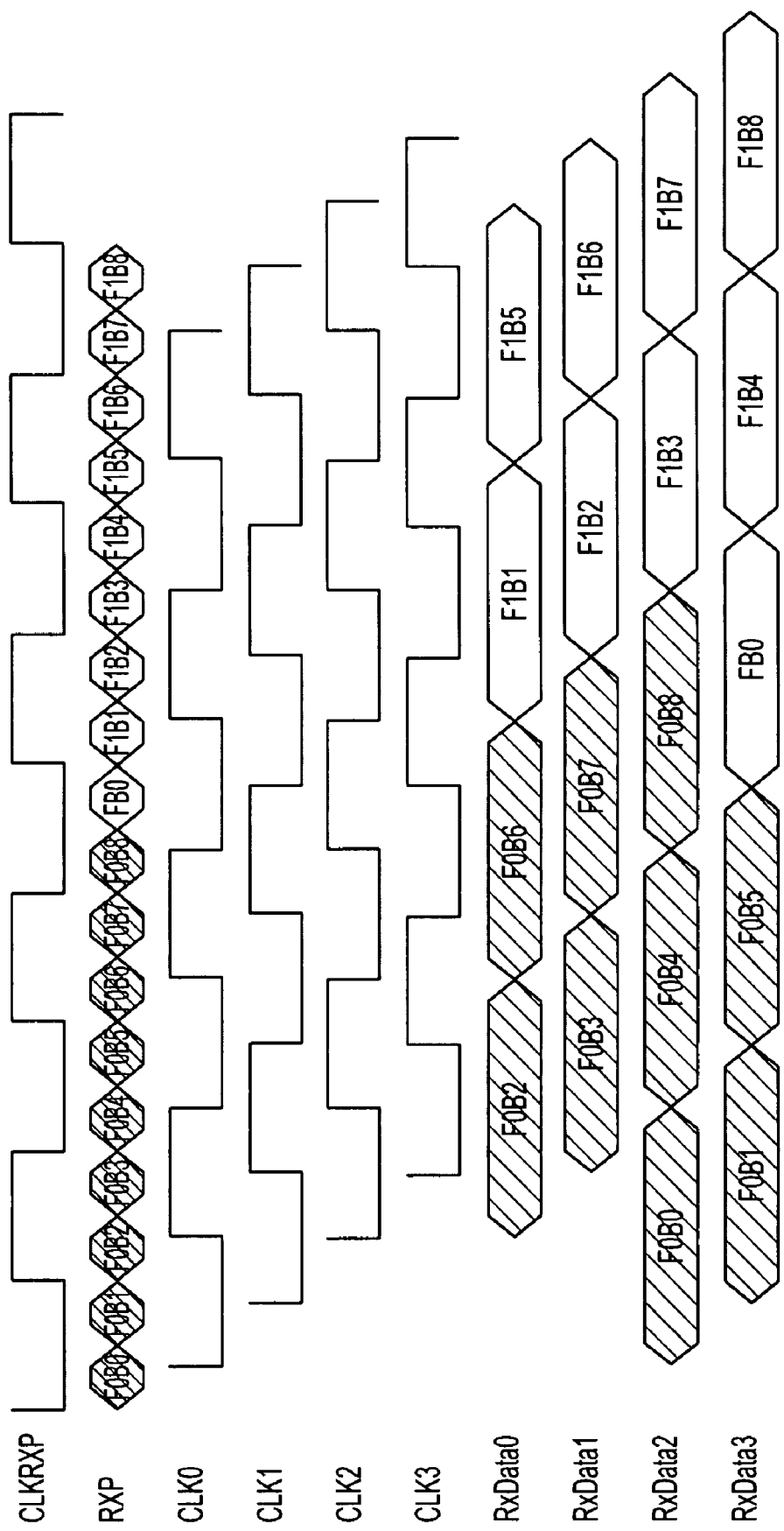
FIG. 6 is a timing diagram showing one embodiment that may be used in the memory device of FIG. 5 capturing frame packets responsive to four phases of a clock signal.

Frame packets received by the memory device 50 at the CA Primary Receiver port 80 are applied to a differential receiver 90, which, in turn, applies them to four differential receivers collectively indicated by the reference numeral 92. Each of the receivers 92 applies the signals to the data input of a respective latch, collectively indicated by the reference numeral 94. The latches 94 are clocked by respective phases of the four-phase Rx CA Clock. The manner in which the frame packets are captured by the four phases CLK0-CLK3 to produce received data RxData0-3 is shown in FIG. 6.

If the frame packet bits captured by the latches 94 are for an access to the memory device 50 rather than to a downstream memory device, the frame packet bits are stored in a respective 4-bit register 98 that is 5 bits deep, and transferred from the register 98 to Rx Framing Logic 100. The Rx Framing Logic 100 recognizes the boundaries of each frame packet. The bits of the frame packet corresponding to a command and an address are applied to a Frame Decoder 110, which separates the bits corresponding to commands, addresses and write data from each other. The address bits are temporarily stored in a Command Queue 114 and applied in sequence to a Row Decoder 120 and a Column Decoder 124. The decoders 120, 124 select rows and columns of memory cells in a memory array 130. The Frame Decoder 110 applies the write data bits to a write buffer 134 wherein they are temporarily stored for subsequent routing to the memory array 130.

The frame bits captured by the latches 94 are also applied to a multiplexer 140. If the frame bits captured by the latches 94 are for an access to a downstream memory device, the multiplexer 140 couples the bits to a second multiplexer 144. The multiplexer 144 is operated by the 4-phases of the Tx CA Clock signal to output 4-bits of data through a differential transmitter 148 to the CA Secondary Transmit port 84 where they are applied to the CA Primary Receive port 80 of a downstream memory device.

Read data from the memory array 130 that is to be transferred to a downstream memory device is applied to a barrel shifter 150, which is operated by a control circuit 152. The barrel shifter 150 receives 64 bits of parallel data from the array 130 and divides the bits into 9 6-bit groups, which are stored in a register 154 along with cyclic redundancy check ("CRC") bits. The bits stored in the register 154 are clocked into four registers generally indicated by reference number 160 by 4 respective phases of the TX CA Clock signal from the PLL 62. The bits stored in the registers 160 are then sequentially coupled through the multiplexers 140, 144 to the CA Secondary Transmit port 84.

The coupling of read data into and through the memory device 50 is similar to the manner in which packet frames are coupled into and through the memory device 50. Specifically, read data bits from a downstream memory device are applied to a DQ Secondary Receiver port 170, which has a width of 4 lanes. The read data bits are applied to a differential receiver 172 and coupled through 4 receivers 174 to the data inputs of 4 latches 178. The latches 178 are clocked by the 4 respective phases of the Rx DQ Clock signal. The read data bits stored in the latches 178 are coupled through a multiplexer 180 to a second multiplexer 182, which is controlled by the 4 phases of the Tx DQ Clock signal to sequentially apply 4 bits to a differential transmitter 186. The transmitter 186 outputs the read data to a DQ Primary Transmit port 188 so the data can be coupled to the DQ Secondary Receive port 170 of an upstream memory device or the host controller 16.

Read data read from the memory array 130 that is to be transferred to the host controller 16 or an upstream memory device is applied to a barrel shifter 190, which is operated by a control circuit 192. The barrel shifter 190 receives 64 bits of parallel data from the array 130 and divides the bits into 9 6-bit groups, which are stored in a register 194 along with cyclic redundancy check ("CRC") bits. The bits stored in the register 194 are clocked into four registers generally indicated by reference number 200 by 4 respective phases of the TX DQ Clock signal from the PLL 62. The bits stored in the registers 200 are then sequentially coupled through the multiplexers 180, 182 to the DQ Primary Transmit port 188.

As mentioned above, configuration data is coupled through the Side Band access bus 34 (FIG. 1) and applied to a Register 210 through a buffer 214. Configuration data from the Register 210 are applied to the Side Band access bus 34 through a second buffer 216. The Side Band access bus 34 is a slow, low pin count bus, which the host controller 16 may use to program the Register 210 with specific timing parameters, or may query certain status registers during link training. There are many potential Side Band configuration bits. Those that are particularly pertinent to initialization are listed in Table 1, below.

TABLE 1

Side band Configuration Bits

| Name | Description |
| --- | --- |
| Cfg.Calibrate | When Cfg.fast_reset is clear, and this bit is set, the DRAM shall enter the calibrate state. When clear, the DRAM shall not enter the calibrate state. |
| Cfg.DevID | Device ID assigned to each DRAM device during side band enumeration. |
| Cfg.DME | An error/status bit that when set, indicates the DRAM device encountered a data merge error, and is unable to complete the data merge established during training. When clear, the DRAM device may complete the data merge. |
| Cfg.Fast_reset | When set, this bit shall force the DRAM into the disable state. When clear, the DRAM may proceed through the other channel states. |
| Cfg.LastDQ | When set, the DRAM is the last device in the DQ serial chain, and its DQ Rx is open. The last DQ device represents the device(s) furthest from the host in the DQ serial chain of devices. When clear, the DRAM is an intermediate device in the DQ serial chain, and its DQ Rx is connected to the DQ Tx of another device. |
| Cfg.LastECA | When set the DRAM is the last device in the CA serial chain, and its CA Tx is unloaded. The last CA device represents the device(s) furthest from the host in the CA serial chain of devices. When clear, the DRAM is an intermediate device in the CA serial chain, and its CA Tx is connected the CA Rx of another device. |
| Cfg.TxOffset0 | Status register indicating the lane 0 Tx offset introduced as a result of the TS2 merge calculations. |
| Cfg.TxOffset1 | Status register indicating the lane 1 Tx offset introduced as a result of the TS2 merge calculations. |
| Cfg.TxOffset2 | Status register indicating the lane 2 Tx offset introduced as a result of the TS2 merge calculations. |
| Cfg.TxOffset3 | Status register indicating the lane 3 Tx offset introduced as a result of the TS2 merge calculations. |

The memory device 50 also receives an Alert signal, which is coupled through a buffer 224 to the Register 210 and from the Register through a buffer 226. Finally, a Reset signal is coupled through a buffer 230 to a reset circuit 234, which resets the memory device 50 at power-up.

As mentioned above, it is usually necessary to initialize the components of a memory system using a high-speed bus prior to use of the system. The memory device 50 includes a Link Interface Unit 238 for this purpose. The Link Interface Unit 238 performs an initialization procedure to allow the Rx Framing Logic 100 to recognize the boundaries of each received frame. The Rx Framing Logic 100 effectively has the ability to adjust the four-phase Tx clocks generated by the PLL 62. This ability allows the frame packet to be reconstructed within the memory device 50 with the correct frame boundaries. As described in greater detail below, frame boundaries are established during training by issuing an identifiable token, then rotating the clock and data muxing until the token has been accurately reconstructed. Once the token is reconstructed, the Rx Framing Logic 100 stops searching for the token, and locks the search state machine. This is referred to as "frame lock." The manner in which the Link Interface Unit 238 and the remainder of the memory device perform their initializing function is explained in detail below. Briefly, the initialization is performed in a manner that allows most of the complexity of initialization to be performed in the host controller 16. This avoids placing a lot of excess complexity in the memory devices that are coupled to the host controller 16.

Figure 7:
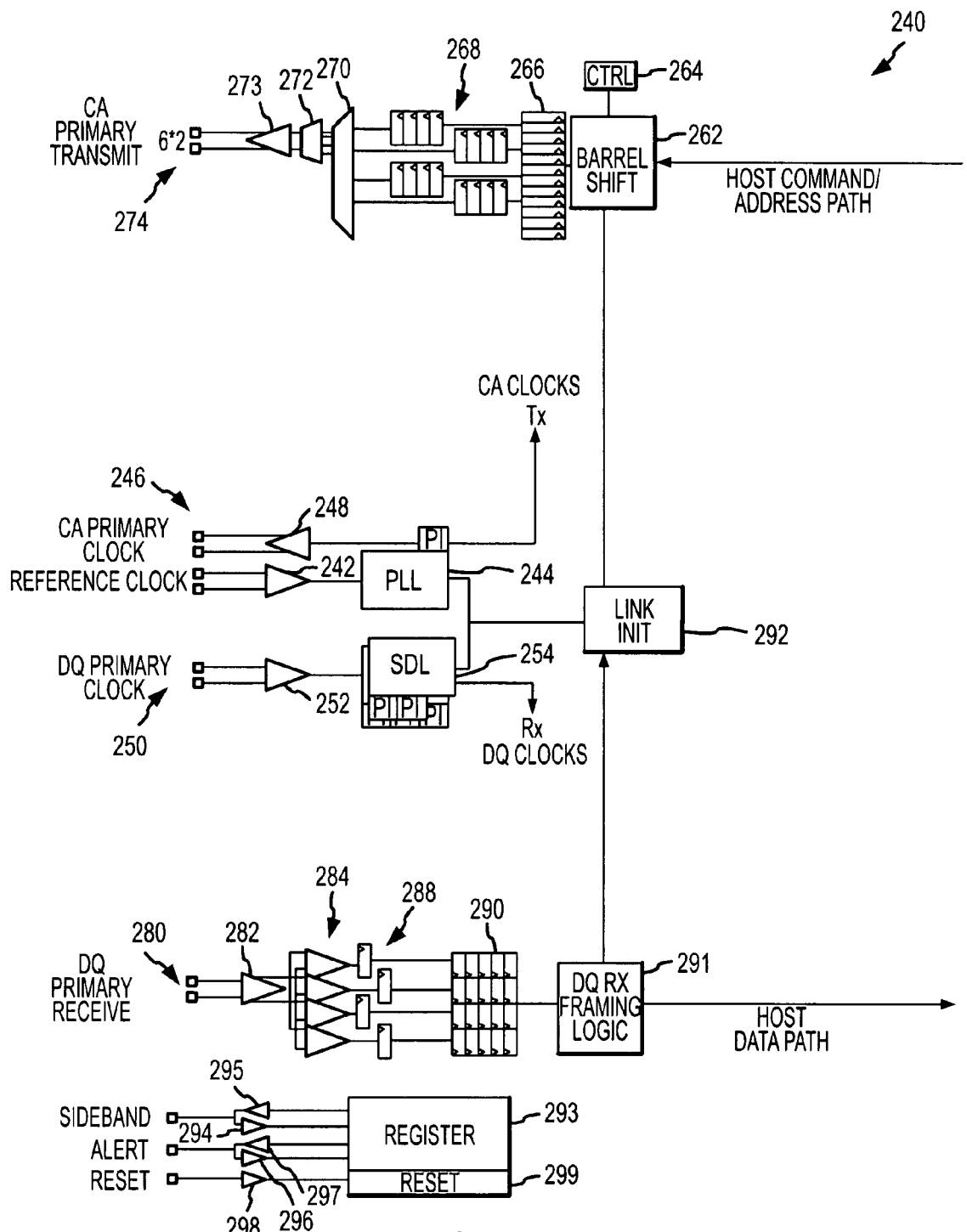
FIG. 7 is a block diagram of a host controller according to one embodiment of the invention that may be used in the computer system of FIG. 1.

One embodiment of a host controller 240 that may be used as the host controller 16 (FIG. 1) is shown in FIG. 7. The host controller 240 includes a receiver 242 that receives a Reference Clock signal from the Reference Clock generator 38 (FIG. 1). The receiver 242 applies the clock signal to a PLL 244, which generates four-phases of an internal clock signal. The PLL 244 also generates and outputs from a CA Primary Clock port 246 four-phases of a CA Primary Clock signal, which are received from a transmitter 248. The CA Primary Clock signal phases are applied to the CA primary Clock port 52 of the memory device 50 to which the host controller 240 is connected. Finally, the PLL 244 generates four-phases of an internal Transmit ("Tx") CA Clock signal, which are in the same clock domain as the host controller 240.

The host controller 240 also receives a DQ Primary Clock signal at a DQ Primary Clock port 250 from the memory device 50 to which it is directly connected. The DQ Primary Clock signal is coupled through a receiver 252 to a synchronous delay line ("SDL") 254, which uses the four-phase internal clock signal generated by the PLL 244 to generate four-phases of a Receive ("Rx") CA Clock signal. The Rx CA Clock signal is in the same clock domain as the memory device 50 transmitting the DQ primary Clock signal.

Memory commands and addresses are applied by conventional memory controller circuitry (not shown) to a barrel shifter 262, which is operated by a control circuit 264. The barrel shifter 262 receives 64 bits of parallel commands and addresses and divides the bits into 9 6-bit groups, which are stored in a register 266 along with cyclic redundancy check ("CRC") bits. The bits stored in the register 266 are clocked into four registers generally indicated by reference number 268 by 4 respective phases of the Tx CA Clock signals from the PLL 244. The bits stored in the registers 268 are then sequentially coupled through multiplexers 270, 272 and a transmitter 273 to a CA Primary Transmit port 274. The port 274 would normally be connected to the CA Primary Receive port 80 (FIG. 5) of the memory device 50 to which it is directly connected.

The host controller 240 also includes a DQ Primary Receive port 280, which receives packets of read data from the memory device 50 to which it is directly connected. The read data is coupled through a differential receiver 282, which, in turn, applies them to four differential receivers collectively indicated by the reference numeral 284. Each of the receivers 284 applies the signals to the data input of a respective latch, collectively indicated by the reference numeral 288. The latches 288 are clocked by respective phases of the four-phase Rx DQ Clock generated by the SDL 254. The data bits are stored in respective 4-bit registers 290 that are 5 bits deep, and transferred from the registers 290 to DQ Rx Framing Logic 291. The Rx Framing Logic 291 recognizes the boundaries of each read data packet.

The barrel shifter 262, PLL 244, SDL 254 and Rx Framing Logic 291 are controlled during initialization by a Link Initialization module 292. This initialization is performed after minor signal skews in the 6 CA lanes from the CA Primary Transmit port 274 of the host controller 240 of less than one unit interval ("UI") in duration have been corrected to achieve "bit lock." Bit lock refers to ensuring that relatively small CA signal skews in the CA lanes from the port 274 of less than one UI have been corrected. This correction is accomplished in the host controller 240 by adjusting the timing at which command and address bits on each of the 6 CA lanes are clocked out of the registers 268 and transmitted from the CA Primary Transmit port 274. Similarly, the below-described initialization is performed after minor signal skews in the 4 DQ lanes from the DQ Primary Transmit port 190 of the memory devices 50 of less than one unit interval ("UI") in duration have been corrected to achieve "bit lock." This correction is accomplished in the host controller 240 by adjusting the timing at which read data bits on each of the 4 DQ lanes are captured by the latches 288.

After bit lock is achieved in the CA lanes and the DQ lanes, a two-part initialization procedure is performed to de-skew the CA lanes and the DQ lanes to correct for coarse lane-to-lane skews, i.e., lane-to-lane skews that are greater than one unit interval ("UI") in duration. During a first TS0 part of the initialization procedure, the memory devices 50 transmit from the DQ Primary Transmit port 190 a pattern of data on all 4 lanes of the port 190. This data pattern is received by the host controller 240 and coupled to the DQ Rx Framing Logic 291. The Framing Logic 291 passes the data pattern to the Link Initialization module 292 in the slower clock domain of the host controller 240. The Link Initialization module 292 then detects any skew in the 4 DQ lanes that has a duration greater than one clock cycle, i.e., greater than a full data unit interval. The Link Initialization module 292 then adjusts the DQ Rx Framing Logic 291 to correctly organize the read data bits received through the DQ Primary Receive port 280 during normal operation.

During a second TS1 part of the initialization procedure, the host controller 240 transmits from the CA Primary Transmit port 274 a pattern of command and address bits on all 6 lanes of the port 274. This pattern is received by the memory devices 50 in sequence, and the pattern on 4 of the 6 CA lanes are passed pack to the DQ Primary Receive port 280 of the host controller 240. The remaining 2 of the 6 CA lanes are subsequently passed pack to the DQ Primary Receive port 280 of the host controller 240 in the same manner. The pattern received at the DQ Primary Receive port 280 is coupled to the DQ Rx Framing Logic 291 and then passed to the Link Initialization module 292. The Link Initialization module 292 then determines the coarse lane-to-lane skew, as explained above. Insofar as the Link Initialization module 292 has already determined the coarse lane-to-lane skew of the DQ lanes, it is able to determine from the skew in the pattern received through the DQ lanes the coarse skew that is attributable to the coarse lane-to-lane skew of the CA lanes. The Link Initialization module 292 then adjusts the Barrel Shifter 262 to compensate for any coarse lane-to-lane in the CA lanes.

As with the memory device 50, the host controller 240 includes a Register 293 that receives configuration data through the Side Band access bus 34 (FIG. 1) and a buffer 294. The Register 293 can also apply Configuration data to the Side Band access bus 34 through a second buffer 295. The host controller 240 also receives an Alert signal, which is coupled through a buffer 296 to the Register 293 and from the Register 293 through a buffer 297. Finally, a Reset signal is coupled through a buffer 298 to a reset circuit 299, which resets the host controller 240 at power-up.

Figure 8:
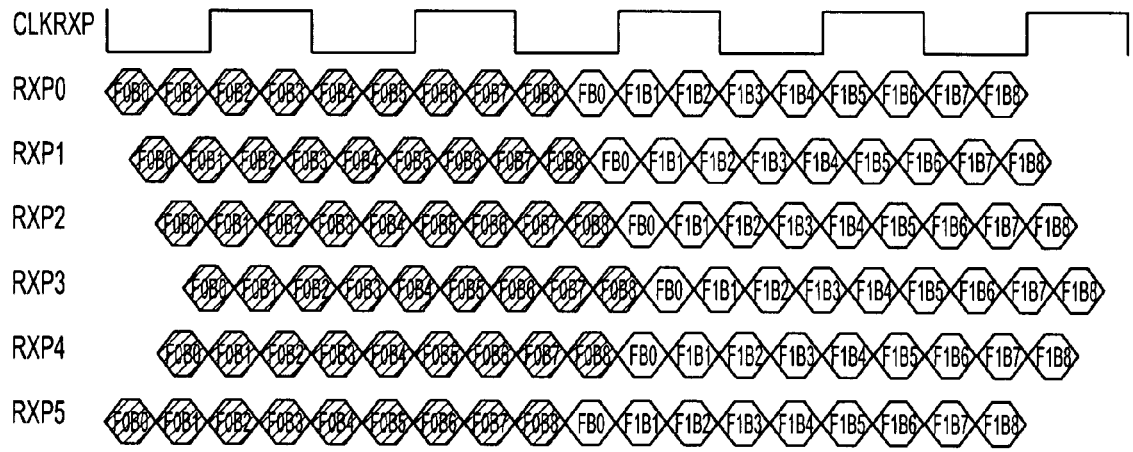
FIG. 8 is a timing diagram showing signal skew that may be present in certain signals coupled from the memory device of FIG. 5 to the host controller of FIG. 7.
Figure 9:
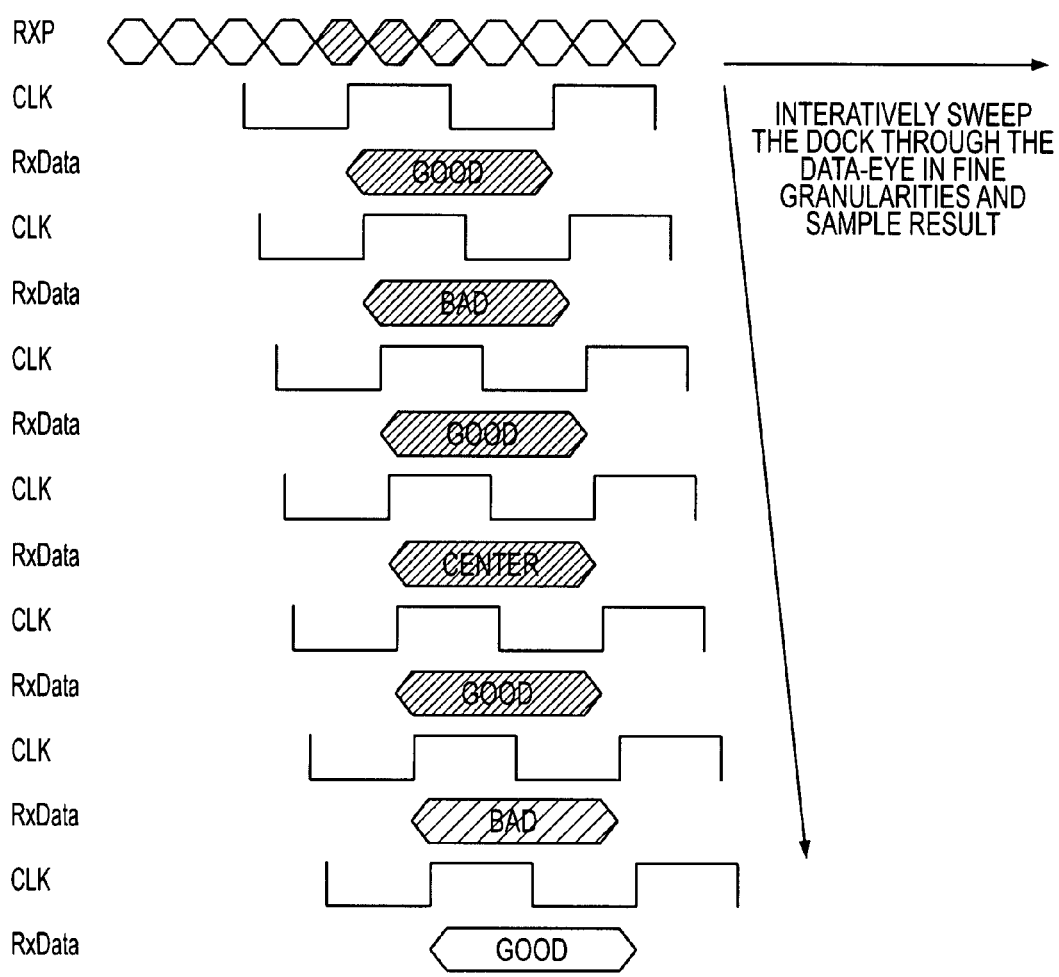
FIG. 9 is a timing diagram showing one embodiment for sweeping the forwarded clock signals relative to the frame packet bits during training.

As mentioned above, before the host controller 240 and memory device 50 can operate, they must be initialized to establish bit-lock, lane de-skew, and frame boundaries. Initialization to establish bit-lock and lane de-skew essentially corrects for timing skew of the frame packets and read data signals as they are coupled to and from, respectively, the memory device 50 with respect to both forwarded clock signals and from lane-to-lane. There will inevitably be some skew between each lane of data as shown in FIG. 8. Therefore each lane can be tuned during training to capture commands, addresses and data accurately. The forwarded clock signals described above are provided as references. These clock signals can be initialized by the host controller 16 adjusting the timing of the clock signals until the four phases of the clock signals are positioned at the center of the "data eye" during which time the bits of the frame packet are valid. More specifically, the correct timing of the forwarded clock signals can be determined by sweeping the forwarded clock signals relative to the frame packet bits in small incremental delays over a period of time during training as shown in FIG. 9. While sweeping the relative timing between the frame packet bits and a forwarded clock signal, the captured frame packet bits are compared to expected data to determine when the frame packet bits in each lane are captured incorrectly at each end of the clock signal sweep. The clock signal is then repositioned to capture the data at the midpoint between the two failing ends of the sweep. This will establish the clock in roughly the center of the data eye and is referred to as bit-lock.

Figure 10:
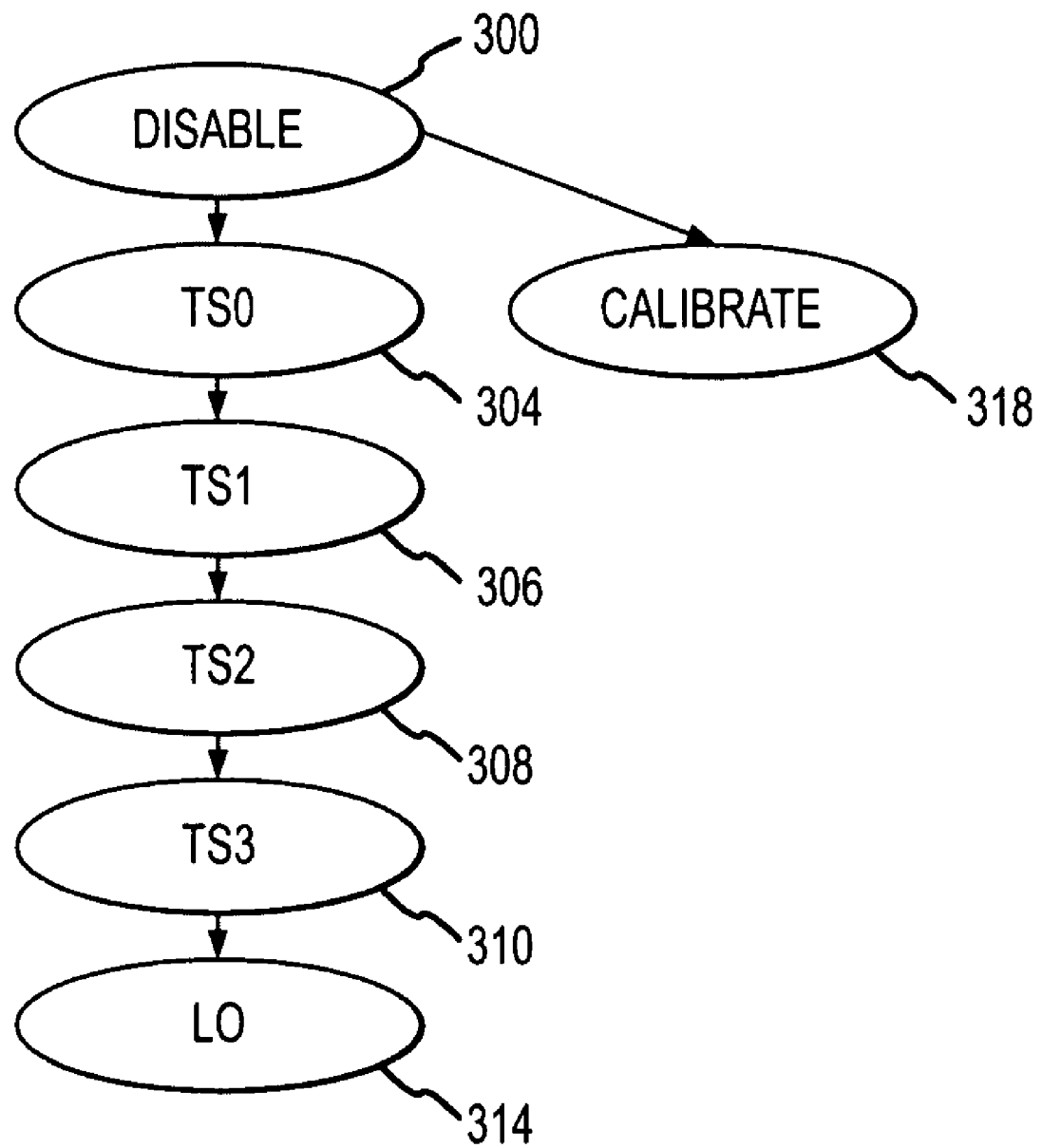
FIG. 10 is a schematic diagram showing one embodiment of a set of protocol rules that may be used to control the operation of the memory device shown in FIG. 5.

After the memory device 50 has been initialized to achieve bit-lock and lane de-skew, it can be initialized to achieve the proper frame boundaries. The memory device 50 is initialized to achieve the proper frame boundaries by issuing ordered sets of training sequences. Training sequences are issued serially on all bit lanes in parallel. A training sequence is composed of several groups of serial transfers, and each group is nine bits in length. Information within each group may include a header, which identifies the training sequence, control information, and other information used to establish a stable channel. Training sequences are sent serially starting from the bit 0 (LSB) to bit 9 (MSB) within each group, then in sequential group order from group 0 to group N. A particular training sequence may be repeated many times before transitioning to the next training sequence. Training sequence transitions are governed by a set of protocol rules to ensure all devices are properly initialized. One embodiment of a set of protocol rules is shown in FIG. 10.

The protocol rules shown in FIG. 10 include several training states, each of which is described in detail below. It is the responsibility of the host controller 16 to transition the system through the training states. These training states are a Disable state 300, in which the communication to and from the host controller 16 is inactive. The second training state is a "TS0" state 304 in which the host controller 16 and the memory device 50 bit-lock each lane, the host controller 16 perform lane de-skew on its own bit lanes, and the host controller 16 frame-locks the read data. The third training state it a "TS1" state 306 in which the host controller 16 achieves frame-lock of the command/address bits, as explained above. As explained above, the command/address bits are bits of the command/address bus that contain a memory command or a memory address. The next training state is a "TS2" state 308 in which the memory device calculates a "DQ merge" if necessary, as described in greater detail below. The fifth training state is a "TS3" state 310 in which user defined test patterns are generated, as also described in greater detail below. The sixth training state is a "L0" state 314 in which the host controller 16 and memory devices 50 are active and frame packets are passed between the memory devices 50 and the host controller 16. The final state is a "Calibrate" state 318 in which the host controller 16 and the memory devices 50 perform receiver offset calibrations using the technique described above.

The objectives of the "Disable" state 300 are to reset interface logic in the host controller 16 and memory devices 50. The memory devices also enter into a self-refresh mode if required. The host controller 16 and the memory device 50 are forced into the Disable state 300 when a hardware reset is asserted, as described above. The host controller 16 may put the memory devices 50 into the Disable state 300 at anytime by setting Cfg.Fast_reset via the side band interface. The host controller 16 should keep the memory devices 50 in the Disable state 300 for a minimum number of clock cycles. When transitioning into the Disable state 300 from any other state, the memory devices 50 may enter into self-refresh mode to preserve the contents stored in the memory devices 50 until the bus enters the L0 state 314. The memory devices 50 should be guaranteed enough time to complete the self-refresh sequence if the host controller 16 adheres to the minimum time to keep the channel in the Disable state 300. The host controller 16 may also keep the memory devices 50 in the Disable state 300 for an indefinite period of time. The characteristics of the Disable state 300 for the memory devices 50 are described in greater detail in Table 2, below:

TABLE 2

Disable State (Memory Devices 50)

| Disable State | Memory Devices 50 |
|---|---|
| Entry Condition | Hardware reset asserted or Cfg.Fast_reset set via side band interface |
| Action | If hardware reset asserted<br>    Terminate any commands in progress including Self-Refresh entry sequence.<br>    If DRAM was in Self-Refresh prior to hardware reset, then maintain self-refresh<br>    Reset all configuration bits, including "sticky" bits.<br>    Reset all interface logic to default state.<br>    Disable CA and DQ Rx inputs.<br>    Disable CA and DQ Tx outputs.<br>Else<br>    Put the DRAM into Self-Refresh.<br>    Reset "non-sticky" configuration bits.<br>    Reset interface logic to default state.<br>    Disable CA and DQ Rx inputs.<br>    Disable CA and DQ Tx outputs. |
| Exit Condition & Next States | If hardware reset de-asserted AND Cfg.Fast_reset clear Transition to TS0 state |

The characteristics of the Disable state 300 for the host controller 16 are described in greater detail in Table 3, below:

TABLE 3

Disable State (Host Controller 16)

| Disable State | Host Controller 16 |
|---|---|
| Entry Condition | System dependent |
| Action | If hardware reset asserted<br>    Reset all configuration bits, including "sticky" bits. Reset all interface logic to default state.<br>    Disable DQ Rx inputs.<br>    Disable CA Tx outputs.<br>Else<br>    Reset "non-sticky" configuration bits. |

TABLE 3-continued

Disable State (Host Controller 16)

| Disable State | Host Controller 16 |
|---|---|
| | Reset interface logic to default state.<br>Disable DQ Rx inputs.<br>Disable CA Tx outputs. |
| Exit Condition<br>& Next States | If hardware reset de-asserted AND Cfg.Fast_reset is clear for minimum of TBD clocks.<br>May transition to TS0 OR Calibrate state |

As explained above, the objectives of TS0 State 304 are to bit-lock the CA and DQ receivers described above, and to frame lock to the slowest CA lane. During the TS0 state 304, the timing of the above-described internal clock signals are adjusted as described above, and the receive data ("DQ") receivers are bit-locked. Additionally, the host controller 16 internally de-skews between DQ Rx lanes and performs frame-lock. Finally, the host controller 16 properly adjusts the timing of its internal clocks. During this state, the host controller 16 achieves bit-lock and frame-lock on the read data ("DQ") receivers, performs de-skew between the read data lanes, and adjusts the timing of internal clocks in the host controller 16. Once Cfg.Fast_reset has been cleared, each of the memory devices 50 drives 0's on both the CA and DQ transmitters. The host controller 16 then issues the TS0 training sequence on the CA transmitter. Each of the memory devices 50 on the same CA segment then performs a bit-lock sequence. Once the memory devices 50 have achieved bit-lock, the memory devices 50 align their internal transmit clocks, determine the slow CA receive lane and frame-lock to the slow lane. Once frame lock has been achieved, the host controller 16 stops outputting 0's, and forwards the TS0 pattern from the CA receiver to the CA transmitter. If the memory devices 50 have their Cfg.LastDQ bit set, the memory devices 50 generate the TS0 training sequence on their DQ transmitter. If the devices 50 have the Cfg.LastDQ bit clear, the memory devices 50 bit-lock the DQ receivers, and then forward the TS0 pattern from the DQ receivers to the DQ transmitters. The training sequence propagates forward in this manner on both the CA and DQ bus segments. The host controller 16 eventually bit-lock each lane of the final DQ segment. Once bit-locked, the host controller 16 may ascertain the lane skew involved in the DQ segment, and internally normalize the DQ lane skew if necessary, as explained above. If the host controller 16 does not see the TS0 training sequence on the DQ receiver within a predetermined time interval, it may assume the channel is broken, and may take whatever user defined steps that are necessary.

The TS0 state 304 for the memory devices 50 is described in greater detail in Table 4, below:

TABLE 4

TS0 State (Memory Devices 50)

| TS0 State | Memory Devices 50 |
|---|---|
| Entry Condition | Enter from the disabled state when Cfg.Fast_reset is clear, and Cfg.Calibrate is clear. |
| Action | If CA Rx is not bit-locked<br>   Drive 0's on CA Tx.<br>   Drive 0's on DQ Tx.<br>   Perform CA Rx bit-lock sequence including appropriate positioning of internal clocks.<br>Else if CA Rx is bit-locked AND not frame-locked to slow CA Rx lane. |

TABLE 4-continued

TS0 State (Memory Devices 50)

| TS0 State | Memory Devices 50 |
|---|---|
| | Frame-lock to the slow CA Rx lane.<br>Else if Frame-lock to slow CA Rx lane<br>   Forward TS0 pattern from CA Rx to CA Tx<br>   If Cfg.LastDQ set<br>      Generate TS0 pattern to DQ Tx.<br>      Ignore DQ Rx.<br>   else if DQ Rx not bit-locked<br>      Continue to drive 0's on DQ Tx<br>      Perform DQ Rx bit-lock sequence<br>   Else<br>      Forward TS0 pattern from DQ Rx to DQ Tx |
| Exit Condition<br>& Next States | If Cfg.fast_reset set<br>   Transition to disable state<br>Else if CA TS1 header detected on a lane<br>   Transition to TS1 |

The TS0 state 304 for the host controller 16 is described in greater detail in Table 5, below:

TABLE 5

TS0 State (Host Controller 16)

| TS0 State | Host Controller 16 |
|---|---|
| Entry Condition | Enter from the disabled state |
| Action | Generate TS0 sequence on CA Tx<br>If DQ Rx is not bit locked<br>   Perform DQ Rx bit-lock sequence including appropriate positioning of internal clocks.<br>Else if DQ Rx lanes are skewed<br>   Perform DQ Rx lane deskew on a Unit Interval (UI) granularity<br>Else if not DQ Rx Frame-lock<br>   Perform DQ Rx Frame-lock<br>Else<br>   May transition to the TS1 state. |
| Exit Condition<br>& Next States | If Cfg.Fast_reset set<br>   Transition to disable state<br>Else if DQ Rx is frame-locked<br>   May transition to TS1 |

One embodiment of a training sequence for the TS0 state 304 is described in Table 6, below:

TABLE 1

TS0 Training Sequence

| Group Number | TS0 Training Sequence Description | Value |
|---|---|---|
| 0 | [8:0] TS0.Header | 9'b0_1111_1110 |
| 1 | [8:0] TS0.Reserved | 9'b0_0000_0000 |
| 2, 4, 6, 8, 10, 12, 14 | [8:0] TS0.PatternA | 9'b0_1010_1010 |
| 3, 5, 7, 9, 11, 13, 15 | [8:0] TS0.PatternB | 9'b1_0101_0101 |

The objectives of the TS1 state 306 are to lane de-skew the CA lanes of the memory devices 50 to allow the host controller 240 to achieve frame-lock on the CA lanes, and properly adjust the timing of internal clock signals. More specifically, during the TS1 state 306, the memory devices 50 map the CA Primary Receive port 80 to the DQ Primary Transmit port 188 to allow the host controller 240 visibility to the CA lane skew. The host controller 16 then de-skews the CA lanes to the slowest lane by causing the Barrel Shifter 262 to introduce delay on the faster lanes. If the Cfg.LastDQ bit is set, the memory devices 50 decode the TS1 control field to determine which of the six CA Rx lanes are to be mapped to the four DQ Tx lanes. Table 10 below illustrates the lane mapping from the CA lanes to the DQ lanes. If the Cfg.LastDQ bit is clear, the memory devices 50 continue to forward the pattern seen on the DQ lanes to the DQ lanes as was being done during the TS0 state 304. As explained above, the Link Initialization module 292 of the host controller 16 may compute the CA receiver lane skew at the memory devices 50, and compensate by deskewing the CA transmitter.

The TS1 state 306 for the memory devices 50 is described in greater detail in Table 7, below:

TABLE 7

TS1 State (Memory Devices 50)

| TS1 State | Memory Devices 50 |
|---|---|
| Entry Condition | Enter from TS0 when the TS1 header is seen on a CA Rx lane |
| Action | Forward CA Rx to CA Tx.<br>If Cfg.LastDQ is clear<br>    Forward the DQ Rx to DQ Tx.<br>Else<br>    Map the CA Rx onto the DQ Tx as shown in Table 10. |
| Exit Condition & Next States | If Cfg.Fast_reset set<br>    Transition to disable state.<br>Else if CA TS2 header detected on a lane.<br>    Transition to TS2. |

The TS1 state 306 for the host controller 16 is described in greater detail in Table 8, below:

TABLE 8

TS1 State (Host Controller 16)

| TS1 State | Host Controller 16 |
|---|---|
| Entry Condition | Enter from the TS0 state |
| Action | Generate TS1 sequence on CA Rx<br>If DQ Rx lanes are not aligned<br>    Add delay to the faster CA Rx lanes in UI granularity.<br>Else<br>    May transition to the TS2 state. |
| Exit Condition & Next States | If Cfg.Fast_reset set<br>    Transition to disable state.<br>Else if DQ Rx lanes are aligned<br>    May transition to TS2. |

One embodiment of a TS1 training sequence is shown in Table 9, below:

TABLE 9

TS1 Training Sequence

| Group Number | TS1 Training Sequence Description | Value |
|---|---|---|
| 0 | [8:0] TS1.Header | 9'b0_1110_1110 |
| 1 | [8:2] TS1.Reserved<br>[1:0] TS1.Map—CA to DQ mapping. Refer to Table 10. | {7'b000_0000, [Map field]} |
| 2, 4, 6 | [8:0] TS1.PatternA | 9'b0_1010_1010 |
| 3, 5, 7 | [8:0] TS1.PatternB | 9'b1_0101_0101 |

One embodiment of a CA to DQ lane mapping as discussed above is shown in Table 10, below:

TABLE 10

CA to DQ Lane Mapping

| Map Field | DQ[3] | DQ[2] | DQ[1] | DQ[0] |
|---|---|---|---|---|
| 2'b00 | CA[4] | CA[3] | CA[1] | CA[0] |
| 2'b01 | CA[5] | CA[4] | CA[2] | CA[1] |
| 2'b10 | CA[1] | CA[0] | CA[4] | CA[3] |
| 2'b11 | CA[2] | CA[1] | CA[5] | CA[4] |

The objectives of TS2 State 308 are to cause memory devices 50 intermediate other memory devices 50 to properly merge DQ transmit data into the DQ data stream. During the TS2 state 308, the intermediate memory devices 50 perform calculations to properly merge DQ transmit data into the data stream seen at the DQ receivers. The TS2 training pattern has a control field called TS2.ID, which uniquely identifies a training pattern. The host controller 16 issues a predetermined minimum number of TS2 patterns. The first TS2 training pattern has a TS2.ID of zero, and each successive TS2 training pattern increment the TS2.ID by one. If Cfg.LastDQ is set in one of the memory devices 50, the memory devices 50 forwards the TS2 pattern seen on the CA receiver onto the DQ transmitter with the same command to read data latency the memory devices 50 would have when in the L0 state 314. If the Cfg.LastDQ is clear, the intermediate memory devices 50 measure the distance between when a particular TS2 training pattern is seen at the CA receiver and the DQ receiver. This measured distance may then be used by the intermediate memory devices 50 to add delay to the DQ transmitted read data path to successfully merge data into the DQ stream. If the intermediate memory devices 50 are unable to merge into the DQ stream, the device shall indicate a data merge error. A data merge error is indicated by setting the Cfg.DME bit, and issuing an alert via the side band bus. The memory devices 50 calculate the data merge within a predetermined minimum number of TS2 training patterns.

The TS2 state 308 for the memory devices 50 is described in greater detail in Table 11, below:

TABLE 11

TS2 State (Memory Devices 50)

| TS2 State | Memory Devices 50 |
|---|---|
| Entry Condition | Enter from TS1 when the TS2 header is seen on the CA Rx |
| Action | If Cfg.LastDQ is set<br>    Reissue the CA Rx pattern to the DQ Tx with the same command to read data latency the device would have in the L0 state.<br>Else<br>    Propagate the DQ Rx pattern to the DQ Tx<br>    Calculate the merge delay by determining the distance between the TS2 seen on the CA and DQ Rx inputs.<br>    Load Cfg.TxOffset0 and Cfg.TxOffset1 status registers with the calculated DQ Tx offsets used to merge successfully. |
| Exit Condition & Next States | If Cfg.Fast_reset set<br>    Transition to disable state.<br>Else if CA TS3 header detected.<br>    Transition to TS3. |

The TS2 state 308 for the host controller 16 is described in greater detail in Table 12, below:

TABLE 12

TS2 State (Host Controller 16)

| TS2 State | Host Controller 16 |
|---|---|
| Entry Condition | Enter from the TS2 state |
| Action | Generate TS2 sequence on CA Rx. |
| Exit Condition & Next States | If Cfg.Fast_reset set<br>    Transition to disable state.<br>Else if minimum of TBD TS2 sequences issued<br>    May transition to TS3. |

One embodiment of a training sequence for the TS2 state 308 is described in greater detail in Table 13, below:

TABLE 13

TS2 Training Sequence

| Group Number | TS2 Training Sequence Description | Value |
|---|---|---|
| 0 | [8:0] TS2.Header | 9'b1_1110_1110 |
| 1 | [8:4] TS2.Reserved<br>[3:0] TS2.ID: Incrementing value | {5'b0_0000,<br>[Incrementing value]} |
| 2, 4, 6 | [8:0] TS2.PatternA | 9'b0_1010_1010 |
| 3, 5, 7 | [8:0] TS2.PatternB | 9'b1_0101_0101 |

The objective of the TS3 state 310 is to perform user defined tests. During the TS3 state, user defined test patterns may be issued to the memory devices 50 to test the integrity of each link segment. The host controller 16 issues user defined test patterns within the TS3 sequence. User defined test patterns are identified between unique start and end delimiters within the TS3 sequence. The user defined sequence may not contain the end delimiter pattern. A control field within the TS3 sequence identifies which memory devices 50 is to map the CA receive pattern on to the DQ transmitter. When Cfg.LastDQ is set, the device unconditionally maps the CA receive pattern on to the DQ transmitter. Table 10 above illustrates how the six CA receive lanes are mapped onto the four DQ transmit lanes. The algorithm used to test each of the link segments and the subsequent actions taken, are user defined.

The characteristics of the TS3 state 310 for the memory devices 50 are shown in greater detail in Table 14, below:

TABLE 14

TS3 State (Memory Devices 50)

| TS3 State | Memory Devices 50 |
|---|---|
| Entry Condition | Enter from TS2 when the TS3 header is seen on the CA Rx |
| Action | If Cfg.LastDQ is set OR TS3.DevID equals Cfg.DevID<br>    Map the CA Rx on to the DQ Tx as shown in Table 10.<br>Else<br>    Forward the DQ Rx on to the DQ Tx |
| Exit Condition & Next States | If Cfg.Fast_reset set<br>    Transition to disable state.<br>Else if Idle frames detected for TBD clocks<br>    Transition to L0 |

The characteristics of the TS3 state 310 for the host controller 16 are shown in greater detail in Table 15, below:

TABLE 15

TS3 State (Host controller 16)

| TS3 State | Host controller 16 |
|---|---|
| Entry Condition | Enter from the TS3 state |
| Action | Generate TS3 sequence on CA Rx. |
| Exit Condition & Next States | If Cfg.Fast_reset set<br>    Transition to disable state.<br>Else if minimum of TBD idle frames issued after TS3 sequence.<br>    May transition to L0. |

One embodiment of a TS3 training sequence is shown in Table 16, below:

TABLE 16

TS3 Training Sequence

| Group Number | TS3 Training Sequence Description | Value |
|---|---|---|
| 0 | [8:0] TS3.Header | 9'b1_1110_1100 |
| 1 | [8] TS3.Reserved<br>[7:0] TS3.DevID: Device ID established during side band enumeration | {1'b0,<br>[Device ID]} |
| 2 | [8:2] TS3.Reserved<br>[1:0] TS3.Map—CA to DQ mapping. Refer to Table 10. | {7'b000_0000,<br>[Map field]} |
| 3 | [8:0] TS2.PatternA | 9'b0_1010_1010 |
| 4 | [8:0] TS2.PatternB | 9'b1_0101_0101 |
| 5 to N − 1 | [8:0] TS3.UserDef—User defined stress pattern | |
| N + 0 | [8:0] TS3.EndDelimiter1 | 9'b1_0011_0111 |
| N + 1 | [8:0] TS3.EndDelimiter2 | 9'b0_1100_1000 |
| N + 2 | [8:0] TS3.EndDelimiter1 | 9'b1_0011_0111 |
| N + 3 | [8:0] TS3.EndDelimiter2 | 9'b0_1100_1000 |
| N + 4 | [8:0] TS2.PatternA | 9'b0_1010_1010 |
| N + 5 | [8:0] TS2.PatternB | 9'b1_0101_0101 |

During the L0 state 314, the Link bus connecting the memory devices 50 to each other and to the host controller 16 are operational, and they are active and ready to decode commands and issue responses. The host controller 16 can issue a minimum of number idle frames after the last TS3 sequence before issuing commands. The memory devices 50 enter the L0 state 314 when a minimum number of idle frames are detected on the CA receiver. The memory devices 50 may be in self-refresh from a previous disable state, and it is the responsibility of the host controller 16 to issue the appropriate commands to exit self-refresh. If Cfg.LastDQ is set, the memory devices 50 issue idle frames on the DQ transmitter.

The L0 state 314 for the memory devices 50 is described in greater detail in Table 17, below:

TABLE 17

L0 State (Memory Devices 50)

| L0 State | Memory Devices 50 |
|---|---|
| Entry Condition | Enter from TS3 when the when TBD idle frames are seen on the CA Rx |
| Action | If Cfg.LastDQ is set<br>    Issue idle frames on to DQ Tx.<br>If Cfg.LastECA is set<br>    Disable CA Tx data and clock outputs.<br>Respond to bus commands when appropriate |
| Exit Condition & Next States | If Cfg.Fast_reset set<br>    Transition to disable state. |

The L0 state 314 for the host controller 16 is described in greater detail in Table 18, below:

TABLE 18

L0 State (Host Controller 16)

| L0 State | Host Controller 16 |
|---|---|
| Entry Condition | Enter from the TS3 state after minimum TBD idle frames issued on CA Tx. |
| Action | Bring DRAMs out of self-refresh if necessary. Issue channel commands as needed. |
| Exit Condition & Next States | If Cfg.Fast_reset set<br>Transition to disable state. |

During the Calibrate state 318, the host controller 16 and the memory devices 50 perform the above-described receiver offset cancellation procedures, and any other necessary calibration steps. The calibrate state 318 is entered when Cfg.Fast_reset is clear, and Cfg.Calibrate is set. The host controller 16 and the memory devices 50 remain in the calibrate state for a minimum number of frames. The calibrate state 318 is exited when the Cfg.Fast_reset is set. The calibrate state 318 only enters from or exits to the Disable state 300.

The Calibrate state 318 is described in greater detail for the memory devices 50 in Table 19, below:

TABLE 19

Calibrate State (Memory Devices 50)

| Calibrate State | Memory Devices 50 |
|---|---|
| Entry Condition | Enter from disable state when Cfg.Fast_reset is clear, and Cfg.Calibrate is set |
| Action | Generate 1's on CA and DQ Tx<br>Perform offset cancellation on CA and DQ Rx data and clocks.<br>Perform any other necessary calibration procedures |
| Exit Condition & Next States | If Cfg.Fast_reset set<br>Transition to disable state. |

The Calibrate state 318 is described in greater detail for the host controller 16 in Table 20, below:

TABLE 20

Calibrate State (Host Controller 16)

| Calibrate State | Host Controller 16 |
|---|---|
| Entry Condition | Enter from disable state when Cfg.Fast_reset is clear, and Cfg.Calibrate is set |
| Action | Generate 1's on CA Tx<br>Perform offset cancellation on CA and DQ Rx data and clocks.<br>Perform any other necessary calibration procedures |
| Exit Condition & Next States | If Cfg.Fast_reset set<br>Transition to disable state. |

While in a particular training state, a given set of training sequences may be issued back-to-back with no gaps. For example, the start of a TS1 sequence should follow the end of the previous TS1 training sequence. While transitioning between states, there may or may not be a gap between different training sequences. The gap between different training sequences should be the idle frame. For example, the end of the TS1 sequence may or may not be followed by idle frames, and then the beginning of the TS2 sequence. Gapping is allowed to give transmitting devices a chance to transition between states and responsibilities. The exception to this is the entry into L0 from TS3, which is defined as a minimum number of idle frames.

Eight-bit memory devices 50 follow the same training protocol as four-bit devices. The actions taken on DQ[3:0] are replicated on DQ[7:4].

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of achieving frame-lock in a memory system having a controller and at least one memory device coupled to the controller, the method comprising:

transmitting patterns of read data from the at least one memory device to the controller though a plurality of read data lanes, the pattern of read data being transmitted in packet frames each of which have a duration of a full unit interval;

capturing the transmitted patterns of read data at the controller;

dividing the patterns of read data captured on each read data lane into a plurality of respective frames;

detecting coarse lane-to-lane skew between any of the frames of read data captured by the controller from respective ones of the read data lanes; and using any detected coarse lane-to-lane skew to alter the manner in which read data captured by the controller are divided into frames.

2. The method of claim 1 wherein the act of dividing the patterns of read data captured by the controller on each read data lane into a plurality of respective frames comprises using framing logic to divide the patterns of read data captured by the controller on each read data lane into a plurality of respective frames.

3. The method of claim 1 wherein the act of detecting any coarse lane-to-lane skew between any of the frames of read data captured by the controller from respective ones of the read data lanes comprises:

translating the frames of read data captured by the controller from a first clock domain to a second clock domain, the second clock domain being slower than the first clock domain; and detecting coarse skew lane-to-lane between any of the translated frames of read data captured by the controller from respective ones of the read data lanes.

4. The method of claim 1, further comprising, before achieving frame-lock, adjusting within less than a full unit interval either the timing at which the read data are transmitted from the at least one memory device or the timing at which the read data are captured by the controller.

5. The method of claim 1, further comprising:

transmitting patterns of command/address bits from the controller to the at least one memory device though a plurality of command/address lanes, the pattern of command/address bits being transmitted in packet frames each of which have a duration of a full unit interval;

capturing the transmitted patterns of command/address bits at the at least one memory device;

transmitting respective patterns of bits from the at least one memory device to the controller though the plurality of read data lanes, the patterns of bits corresponding to respective patterns of command/address bits received and captured by the at least one memory device;

capturing the transmitted patterns of bits at the controller;

dividing the patterns of bits captured on each read data lane into a plurality of respective frames;

detecting coarse lane-to-lane skew between any of the frames of bits captured by the controller from respective ones of the read data lanes; and using any detected coarse skew lane-to-lane of the frames of bits captured by the controller from respective ones of the read data lanes and any detected coarse lane-to-lane skew of the frames of read data captured by the controller from respective ones of the read data lanes to alter the manner in which frames of command/address bits are transmitted from the controller to the at least one memory device though the plurality of command/address lanes.

6. The method of claim 5 wherein the act of altering the manner in which frames of command/address bits are transmitted from the controller to the at least one memory device comprises altering the timing at which command/address bits are transmitted on at least one of the plurality of command/address lanes relative to the timing at which command/address bits are transmitted on another of the plurality of command/address lanes.

7. The method of claim 6 wherein the act of altering the timing at which command/address bits are transmitted on at least one of the plurality of command/address lanes comprises:

applying frames of command/address bits to a barrel shifter; and using the barrel shifter to alter the frame of command/address bits on at least one of the plurality of command/address lanes relative to a respective frame of command/address bits on another of the plurality of command/address lanes.

8. The method of claim 5 wherein the number of command/address lanes is greater than the number of read data lanes, and wherein the act of transmitting respective patterns of bits from the at least one memory device to the controller though the plurality of read data lanes comprises:

dividing the patterns of command/address bits transmitted through the plurality of command/address lanes and captured at the at least one memory device into respective subsets of the command/address bits transmitted through less than all of the command/address lanes;

providing respective subsets of the bits corresponding to the subsets of the command/address bits; and transmitting the subsets of the bits from the at least one memory device to the controller though the plurality of read data lanes.

9. The method of claim 1, further comprising coupling a signal from the controller to the at least one memory device to place the at least one memory device in a low-power disable state.

10. A method of achieving frame-lock in a memory system having a controller and at least one memory device coupled to the controller, the method comprising:

transmitting patterns of command/address bits from the controller to the at least one memory device though a plurality of command/address lanes, the pattern of command/address bits being transmitted in packet frames;

capturing the transmitted patterns of command/address bits at the at least one memory device;

transmitting respective patterns of bits from the at least one memory device to the controller through a plurality of the read data lanes, the patterns of bits corresponding to respective patterns of command/address bits captured by the at least one memory device;

capturing the transmitted patterns of bits at the controller;

dividing the patterns of bits captured by the controller into a plurality of respective frames;

detecting coarse lane-to-lane skew between any of the frames of bits captured by the controller from respective ones of the read data lanes; and using any detected coarse lane-to-lane skew of the bits to alter the manner in which frames of command/address bits are transmitted from the controller to the at least one memory device though the plurality of command/address lanes.

11. The method of claim 10 wherein the act of altering the manner in which frames of command/address bits are transmitted from the controller to the at least one memory device comprises altering the timing at which command/address bits are transmitted on at least one of the plurality of command/address lanes relative to the timing at which command/address bits are transmitted on another of the plurality of command/address lanes.

12. The method of claim 10 wherein the act of dividing the patterns of bits captured by the controller into a plurality of respective frames comprises using framing logic to divide the patterns of bits captured by the controller into a plurality of respective frames.

13. The method of claim 10 wherein the act of detecting coarse lane-to-lane skew between any of the bits captured by the controller from respective ones of the read data lanes comprises:

translating the frames of bits captured by the controller from a first clock domain to a second clock domain, the second clock domain being slower than the first clock domain; and detecting any coarse lane-to-lane skew between any of the translated frames of bits captured by the controller from respective ones of the read data lanes.

14. The method of claim 10, further comprising, before achieving frame-lock, adjusting within less than a full unit interval either the timing at which the command/address bits are transmitted from the controller or the timing at which the command/address bits are captured by the at least one memory device.

15. The method of claim 10, further comprising coupling a signal from the controller to the at least one memory device to place the at least one memory device in a low-power disable state.

16. A memory system, comprising:

a read data bus having a plurality of read data lanes;

at least one memory device operable to output patterns of read data from a read data port having a plurality of read data lanes, the pattern of read data being transmitted in packet frames; and a controller, comprising:

a read data port having a plurality of read data lanes, the read data port being coupled to the read data port of the at least one memory device through the read data bus;

read data latches coupled to the read data port, the read data latches being operable to capture the patterns of read data output by the at least one memory device through respective ones of the read data lanes of the read data port;

framing logic coupled to receive the patterns of read data from the read data latches, the framing logic being operable to divide the patterns of read data into a plurality of respective frames; and a link initialization module coupled to receive the frames of read data from the framing logic, the link initialization module being operable to detect coarse laneto-lane skew between any of the frames of read data received on respective ones of the read data lanes, the link initialization module being operable to cause alteration of the manner in which read data received from the read data latches are divided into frames based on any coarse lane-to-lane skew detected by the link initialization module.

17. The memory system of claim 16 wherein the framing logic is operable to convert the patterns of read data received from the read data latches from a first clock domain to a second clock domain, the second clock domain being slower than the first clock domain.

18. The memory system of claim 16 wherein the controller is operable to output patterns of command/address bits from a command/address port having a plurality of command/address lanes, the controller outputting the command/address bits in packet frames; and wherein the at least one memory device comprises:
a command/address port having a plurality of command/address lanes, the command/address port being coupled to the command/address port of the controller through the command/address bus;
command/addresses latches coupled to the command/address port, each of the command/address latches being operable to capture the patterns of command/address bits output received on respective command/address lanes of the command/address port; and
a bypass path coupling at least some of the command/address latches to respective ones of the read data lanes of the read data port.

19. The memory system of claim 18 wherein the framing logic is operable to divide the patterns of command/address bits received from the at least one memory device into a plurality of respective frames, and wherein the link initialization module is operable to detect coarse lane-to-lane skew between any of the frames of the command/address bits received from the at least one memory device on respective ones of the read data lanes and to cause alteration of the manner in which frames of command/address bits are output from the controller based on any skew detected by the link initialization module between any of the frames of the command/address bits received on respective ones of the read data lanes and between any of the frames of read data received on respective ones of the read data lanes.

20. The memory system of claim 18 wherein the controller further comprises a barrel shifter coupled to the link initialization module, the barrel shifter being operable to receive command/address bits and being operable to alter the timing at which command/address bits are output on at least one of the plurality of command/address lanes of the command/address port relative to the timing at which command/address bits are output from on another of the plurality of command/address lanes of the command/address port.

21. The memory system of claim 18 wherein the number of command/address lanes of the command/address port of the at least one memory device is greater than the number of read data lanes of the read data port of the at least one memory device, and wherein the memory device further comprises a multiplexer coupled to the command/address latches and the read data port of the at least one memory device, the multiplexer being operable to couple a first subset of the command/address latches to respective ones of the read data lanes of the read address port and to subsequently couple a second subset of the command/address latches to respective ones of the read data lanes of the read address port.

22. The memory system of claim 16 further comprising a side band access bus extending between the controller and the at least one memory device, the side bank access bus being operable to pass configuration data from the controller to the at least one memory device.

23. A memory device controller, comprising:
a data port having a plurality of lanes;
data latches coupled to the data port, the data latches being operable to capture patterns of digital data applied to the data port on respective ones of the lanes of the data port;
framing logic coupled to receive the patterns of digital data from the data latches, the framing logic being operable to divide the patterns of digital data into a plurality of respective frames; and
a link initialization module coupled to receive the frames of digital data from the framing logic, the link initialization module being operable to detect coarse lane-to-lane skew between any of the frames of data received from the framing logic, the link initialization module being operable to cause alteration of the manner in which data received from the data latches are divided into frames based on any coarse lane-to-lane skew detected by the link initialization module.

24. The memory device controller of claim 23 wherein the framing logic is operable to convert the patterns of digital data received from the data latches from a first clock domain to a second clock domain, the second clock domain being slower than the first clock domain.

25. The memory device controller of claim 23, further comprising a barrel shifter coupled to the link initialization module, the barrel shifter being operable to receive digital signal bits and being operable to alter the timing at which the digital signal bits are output on at least one of a plurality lanes of an output port relative to the timing at which the digital signals bits are output from on another of the plurality of lanes of the output port.

26. A processor-based system, comprising:
a processor;
at least one memory device operable to output patterns of read data from a read data port, the pattern of read data being transmitted in packet frames; and
a host controller coupled to the processor through a processor bus and coupled to the at least one memory device through a read data bus having a plurality of read data lanes, the host controller comprising:
read data latches coupled to the read data bus, the read data latches being operable to capture the patterns of read data output by the at least one memory device;
framing logic coupled to receive the patterns of read data from the read data latches, the framing logic being operable to divide the patterns of read data into a plurality of respective frames; and
a link initialization module coupled to receive the frames of read data from the framing logic, the link initialization module being operable to detect coarse lane-to-lane skew between any of the frames of read data received on respective ones of the read data lanes, the link initialization module being operable to cause alteration of the manner in which read data received from the read data latches are divided into frames based on any coarse lane-to-lane skew detected by the link initialization module.

27. The processor-based system of claim 26 wherein the framing logic is operable to convert the patterns of read data received from the read data latches from a first clock domain to a second clock domain, the second clock domain being slower than the first clock domain.

28. The processor-based system of claim 26 wherein the host controller is operable to couple patterns of command/ address bits to the at least one memory device through a command/address bus having a plurality of command/address lanes, the host controller outputting the command/address bits in packet frames; and wherein the at least one memory device comprises:

command/addresses latches coupled to the command/address bus, each of the command/address latches being operable to capture the patterns of command/address bits output by the host controller and received on respective command/address lanes of the command/address bus; and a bypass path coupling at least some of the command/address latches to respective ones of read data lanes of the read data bus.

29. The processor-based system of claim 28 wherein the framing logic is operable to divide the patterns of command/address bits received from the at least one memory device into a plurality of respective frames, and wherein the link initialization module is operable to detect coarse lane-to-lane skew between any of the frames of the command/address bits received from the at least one memory device on respective ones of the read data lanes and to cause the framing logic to alter the manner in which frames of command/address bits are output from the host controller based on any skew detected by the link initialization module between any of the frames of the command/address bits received on respective ones of the read data lanes and between any of the lanes of the frames of read data received one respective ones of the read data lanes.

30. The processor-based system of claim 28 wherein the controller further comprises a barrel shifter coupled to the link initialization module, the barrel shifter being operable to receive command/address bits and being operable to alter the timing at which command/address bits are output on at least one of the plurality of command/address lanes of the command/address bus relative to the timing at which command/address bits are output from on another of the plurality of command/address lanes of the command/address bus.

31. The processor-based system of claim 28 wherein the number of command/address lanes of the command/address bus is greater than the number of read data lanes of the read data bus, and wherein the memory device further comprises a multiplexer coupled to the command/address latches and the read data bus, the multiplexer being operable to couple a first subset of the command/address latches to respective ones of the read data lanes of the read address bus and to subsequently couple a second subset of the command/address latches to respective ones of the read data lanes of the read address bus.

32. The processor-based system of claim 26, further comprising a side band access bus extending between the host controller and the at least one memory device, the side bank access bus being operable to pass configuration data from the controller to the at least one memory device.

* * * * *